(12) United States Patent
Zhang et al.

(10) Patent No.: US 11,283,014 B2
(45) Date of Patent: Mar. 22, 2022

(54) RRAM CROSSBAR ARRAY CIRCUITS WITH SPECIALIZED INTERFACE LAYERS FOR LOW CURRENT OPERATION

(71) Applicant: TETRAMEM INC., Newark, CA (US)

(72) Inventors: Minxian Zhang, Newark, CA (US); Ning Ge, Newark, CA (US)

(73) Assignee: TETRAMEM INC., Newark, CA (US)

( * ) Notice: Subject to any disclaimer, the term of this patent is extended or adjusted under 35 U.S.C. 154(b) by 0 days.

(21) Appl. No.: 16/553,173

(22) Filed: Aug. 28, 2019

(65) Prior Publication Data

US 2021/0066589 A1    Mar. 4, 2021

(51) Int. Cl.
*H01L 29/06* (2006.01)
*H01L 45/00* (2006.01)
*H01L 27/24* (2006.01)

(52) U.S. Cl.
CPC ...... *H01L 45/1253* (2013.01); *H01L 27/2463* (2013.01); *H01L 45/146* (2013.01); *H01L 45/1616* (2013.01)

(58) Field of Classification Search
CPC ............ H01L 27/2463; H01L 45/1253; H01L 45/146; H01L 45/1616
See application file for complete search history.

(56) References Cited

U.S. PATENT DOCUMENTS

| 8,362,457 B2 * | 1/2013 | Kim | H01L 45/1616 257/4 |
| 2007/0295950 A1 * | 12/2007 | Cho | H01L 45/04 257/4 |
| 2016/0148979 A1 * | 5/2016 | Kim | H01L 43/08 711/125 |
| 2019/0115529 A1 * | 4/2019 | Liu | H01L 29/51 |
| 2020/0185532 A1 * | 6/2020 | Lin | H01L 21/02568 |

* cited by examiner

*Primary Examiner* — Phuc T Dang
(74) *Attorney, Agent, or Firm* — MagStone Law LLP (57) ABSTRACT

Technologies relating to RRAM crossbar array circuits with specialized interface layers for the low current operations are disclosed. An example apparatus includes: a substrate; a bottom electrode formed on the substrate; a first layer formed on the bottom electrode; an RRAM oxide layer formed on the first layer and the bottom electrode; and a top electrode formed on the RRAM oxide layer. The first layer may be a continuous layer or a discontinuous layer. The apparatus may further comprise a second layer formed between the RRAM oxide layer and the top electrode. The second layer may be a continuous layer or a discontinuous layer.

18 Claims, 10 Drawing Sheets

| Oxide | Band Gap (eV) |
|---|---|
| SiO2 | 9 |
| α-Al2O3 | 8.3-8.8 |
| Si3N4 | 5 |
| AlN | 6 |
| Ta2O5 | 3.8 - 5.3 |
| HfO2 | 5.3 - 5.7 |

| | HBD | SBD |
|---|---|---|
| Film Thickness | Thick | Thin |
| Breakdown Voltage | High | Low |
| Breakdown Current | High, Abrupt Increase | Low, Gradual Increase |
| Film Structure | Destructive | Non-destructive |
| Effect on Film | Irreversible | Reversible |

- ALD rate ~ 0.1 nm/cycle
  - <10 cycles, island growth
  - >10 cycles, layer growth （> 1nm)

FIG. 8

RRAM CROSSBAR ARRAY CIRCUITS WITH SPECIALIZED INTERFACE LAYERS FOR LOW CURRENT OPERATION

TECHNICAL FIELD

The present disclosure relates generally to a crossbar array circuit with a Resistive Random-Access Memory (RRAM) and more specifically to RRAM crossbar array circuits with specialized interface layers for the low current operations.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, and so on.

A RRAM is a two-terminal passive device capable of changing resistance responsive to sufficient electrical stimulations, which have attracted significant attention for high-performance non-volatile memory applications. The resistance of a RRAM may be electrically switched between two states: A High-Resistance State (HRS) and a Low-Resistance State (LRS). The switching event from an HRS to an LRS is often referred to as a "Set" or "On" switch; the switching systems from an LRS to an HRS is often referred to as a "Reset" or "Off" switching process.

SUMMARY

Technologies relating to RRAM crossbar array circuits with specialized interface layers for the low current operations are provided.

An apparatus, in some implementations, includes: a substrate; a bottom electrode formed on the substrate; a first layer formed on the bottom electrode; a RRAM oxide layer formed on the first layer and the bottom electrode; and a top electrode formed on the RRAM oxide layer.

In some implementations, the substrate is made of one or more of the following materials: Si, $SiO_2$, $Si_3N_4$, $Al_2O_3$, AlN,), or glass.

In some implementations, the bottom electrode is made of one or more of the following materials: Pd, Pt, Ir, W, Ta, Hf, Nb, V, Ti, TiN, TaN, NbN, a combination thereof, or an alloy of any of these materials with any other conductive materials.

In some implementations, the RRAM oxide layer is made of one or more of the following materials: $TaO_x$ (where $x \le 2.5$), $HfO_x$ (where $x \le 2$), $TiO_x$ (where $x \le 2$), $ZrO_x$ (where $x \le 2$), or a combination thereof.

In some implementations, the first layer is a discontinuous layer and is made of one or more of the following materials: comprises $Al_2O_3$, $SiO_2$, $Si_3N_4$, AlN, or a combination thereof.

In some implementations, a thickness of the first layer is less than 0.4 nm.

In some implementations, the first discontinuous layer is deposited by ALD with less than 4 cycles.

The apparatus, in some implementations, further includes a second layer formed between the RRAM oxide layer and the top electrode.

In some implementations, the second layer is a discontinuous layer; the first layer may be a continuous layer or a discontinuous layer.

In some implementations, a thickness of the second layer is less than 0.4 nm.

An apparatus, in some implementations, includes: a substrate; a bottom electrode formed on the substrate; a RRAM oxide layer formed on the bottom electrode; a first layer formed on the RRAM oxide layer; and a top electrode formed on the first discontinuous layer and the RRAM oxide layer.

In some implementations, the first layer is a discontinuous layer.

An apparatus, in some implementations, further includes a second layer formed on the bottom electrode.

In some implementations, the second layer is a continuous layer or a discontinuous layer.

An apparatus, in some implementations, includes: a substrate; a bottom electrode formed on the substrate; a first interlayer formed on the bottom electrode; a RRAM oxide layer formed on the first interlayer; and a top electrode formed on the RRAM oxide layer.

The apparatus, in some implementations, further includes a second interlayer formed between the RRAM oxide layer and the top electrode.

In some implementations, the thickness of the first interlayer is less than 1 nm.

DETAILED DESCRIPTION

The implementations disclosed herein are illustrated by way of example, and not by way of limitation, in the figures of the accompanying drawings. Like reference numerals refer to corresponding parts throughout the drawings.

Technologies relating to RRAM crossbar array circuits with specialized interface layers for the low current operations are disclosed. The technologies described in the present disclosure may provide the following technical advantages.

First, the disclosed interface engineering techniques and designs of a RRAM stack may reduce current during LRS operations, rendering them particularly advantageous when used in low current, analog, multilevel in-memory computing (IMC) scenarios.

Second, the disclosed technologies provide suitable materials and specific thickness during designated cycles of a forming process to achieve a soft breakdown of interlayers rather than a hard breakdown, and thus protect the interlayers from irreversible damage, which is an undesirable consequence during an interface engineering process.

Third, when an Atom Layer Deposition (ALD) process is used during interface engineering, no additional lithography process is required to obtain the island structure (discontinuous layer).

Figure 1A:
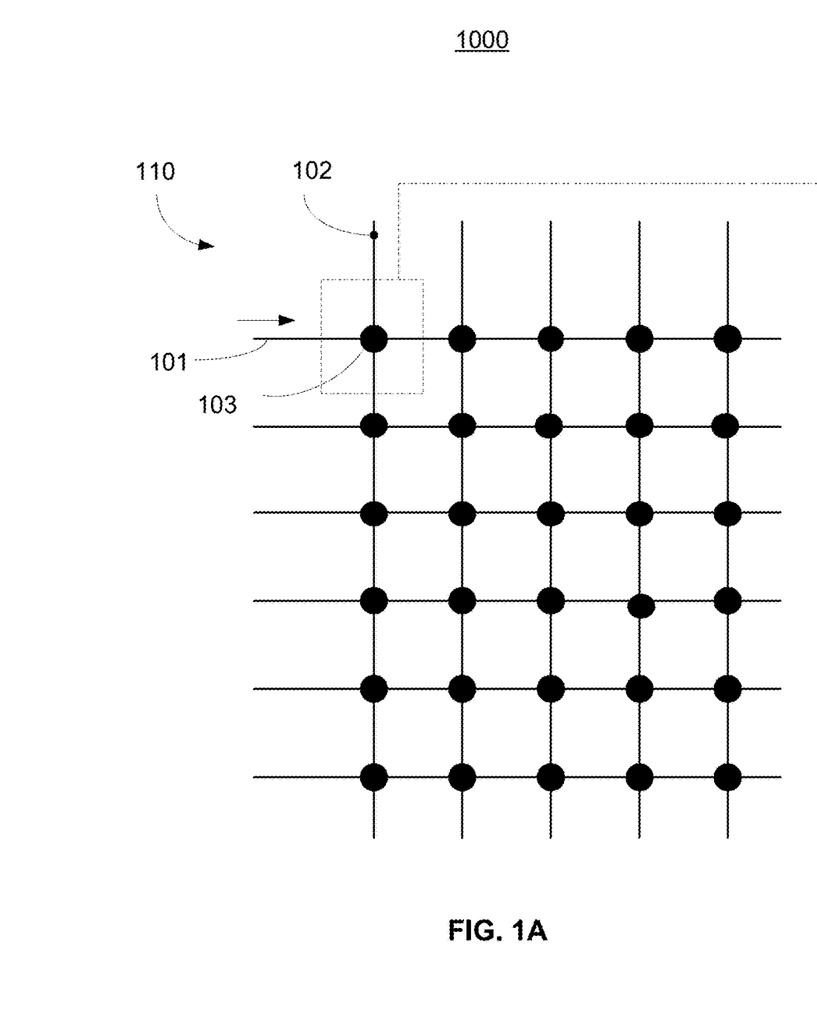
FIG. 1A is a block diagram illustrating an example crossbar array circuit in accordance with some implementations of the present disclosure.

FIG. 1A is a block diagram 1100 illustrating an example crossbar array circuit in accordance with some implementations of the present disclosure. As shown in FIG. 1A, the crossbar array circuit 110 includes a plurality of row wires (e.g., a first-row wire 101), a plurality of column wires (e.g., a first column wire 102), and a plurality of cross-point devices (e.g., a cross-point device 103).

Figure 1B:
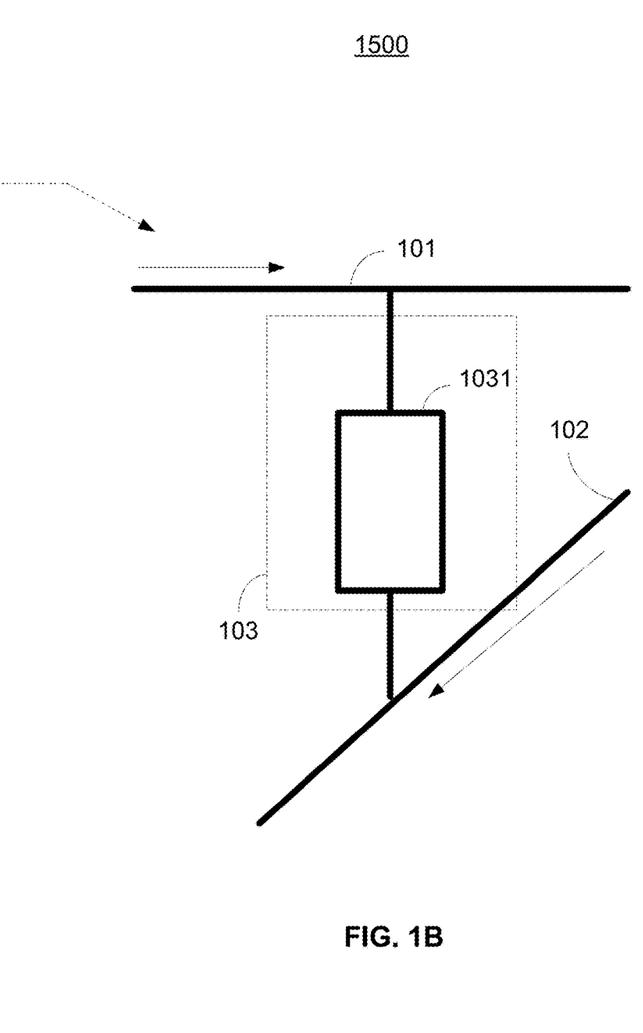
FIG. 1B is a block diagram illustrating an example cross-point device within the crossbar array circuit shown in FIG. 1A, in accordance with some implementations of the present disclosure.

FIG. 1B is a block diagram 1500 illustrating the example cross-point device 103 shown in FIG. 1A, in accordance with some implementations of the present disclosure. As shown in FIG. 1B, the cross-point device 103 is connected to the first row wire 101 and the first column wire 102. The cross-point device 103, in some implementations, includes an RRAM stack 1031.

As explained above, when used in a low current, analog, multilevel in-memory computing applications, a RRAM stack requires a lower current during LRS operations. To provide lower current, resistance needs to be increased during a filament forming and operation process. Such increased resistance may be provided by interface engineering technologies discussed in the present disclosure.

Figure 2A:
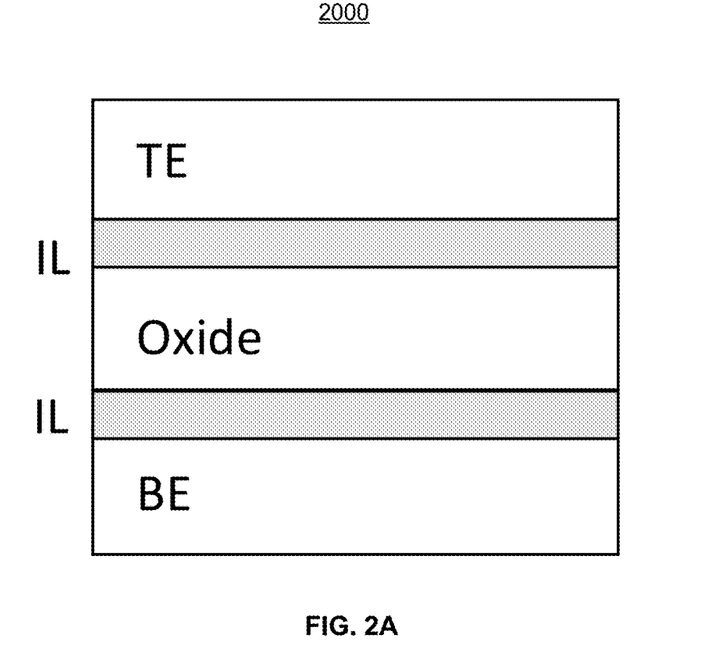
FIG. 2A is a block diagram illustrating an example RRAM device with two interface layers (IL) in accordance with some implementations of the present disclosure.

FIG. 2A is a block diagram 2000 illustrating an example RRAM stack with two interface layers in accordance with some implementations of the present disclosure.

As shown in FIG. 2A, a RRAM stack may include a Bottom Electrode (BE) layer, a first Interface Layer (IL), an Oxide switching layer, a second Interface Layer (IL), and a Top Electrode (TE) layer.

Various techniques may be applied to provide increased resistance, which is needed during a filament forming and operation process.

For example, a Bottom Electrode (BE) surface treatment may be performed, before the RRAM oxide layer is deposited. For another example, a RRAM oxide surface treatment may be performed, before the Top Electrode (TE) layer is deposited.

In addition, as shown in FIG. 2A, an Interface Layer (IL) may be deposited between the RRAM oxide layer and the Bottom Electrode (BE) layer. Another Interface Layer (IL) may be deposited between the RRAM oxide layer and the Top Electrode (TE) layer. A combination of the above-explained techniques may also be applied to provide increased resistance.

Figure 2B:
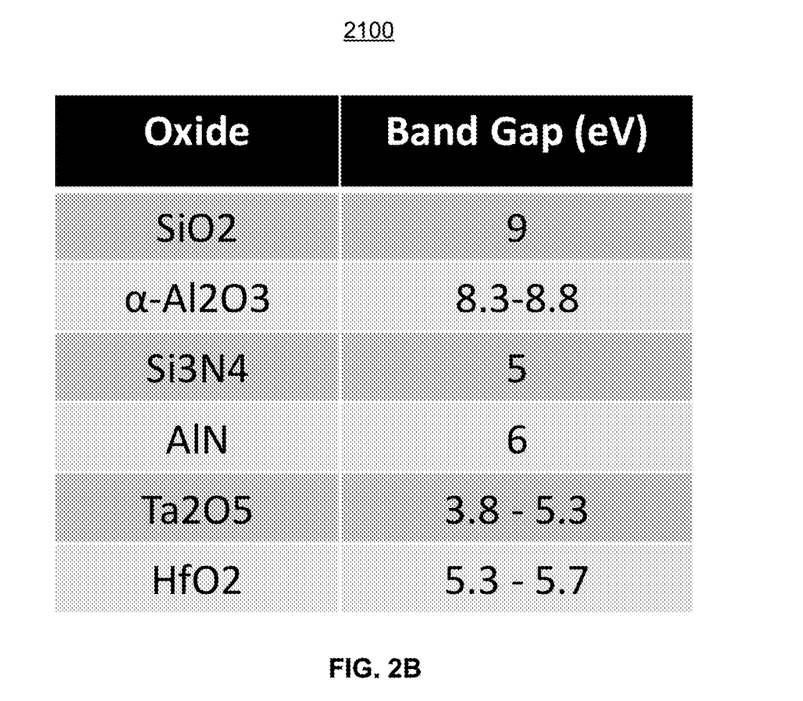
FIG. 2B is a table illustrating example band gaps of different oxide and nitride materials.

FIG. 2B is a table illustrating example band gaps of different oxide and nitride materials. These example band-gap oxides and nitrides may be used to form the one or more Interface Layers (IL). As shown in FIG. 2B, such materials as $Al_2O_3$, $SiO_2$, $Si_3N_4$, AlN, or other materials which may have a wider bandgap than that of a RRAM oxide may be used.

The use of wide bandgap oxides, in addition to reducing the thickness of interface layers (made of these materials) to a sufficiently thin level, electronic conduction by way of electrons tunneling may be achieved, which may significantly increase device resistance and thus reduce device current.

Figure 2C:
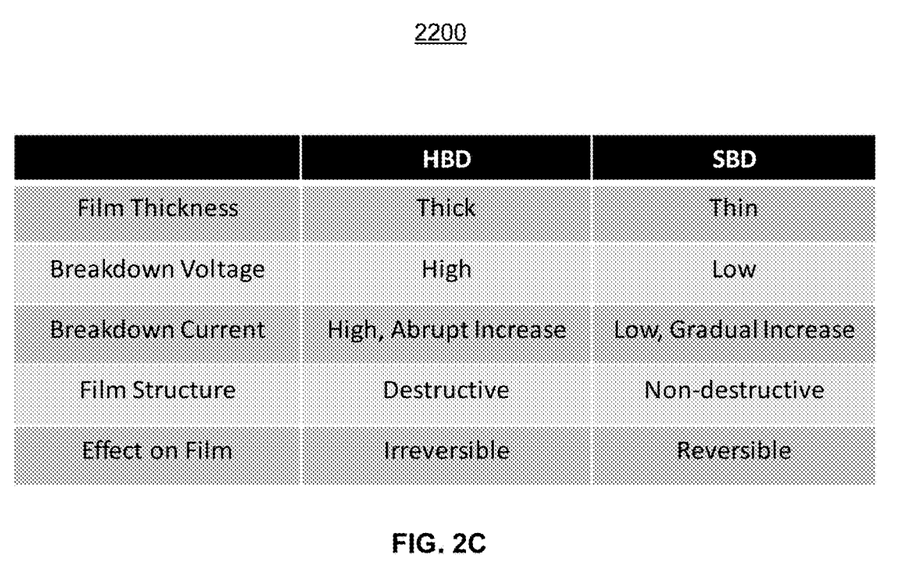
FIG. 2C is a table illustrating example differences between a hard breakdown (HBD) and a soft breakdown (SBD) in accordance with some implementations of the present disclosure.

FIG. 2C is a table illustrating example differences between a hard breakdown (HBD) and a soft breakdown (SBD) in accordance with some implementations of the present disclosure.

An SBD may occur at a low electric field with a gradual increase in leakage current, and is non-destructive and thus reversible; in contrast, an HBD may occur at a high electric field with an abrupt increase in leakage current and is destructive and thus irreversible.

The technologies described in the present disclosure take advantage of tunneling effects through an ultra-thin oxide or nitride; an SBD is therefore desired. An ultra-thin dielectric film may be configured to form as interface layers between an electrode and an oxide layer to provide increased contact resistance and to achieve low current, low voltage, and analog RRAM needed for In-Memory Computing (IMC) applications.

Figure 2D:
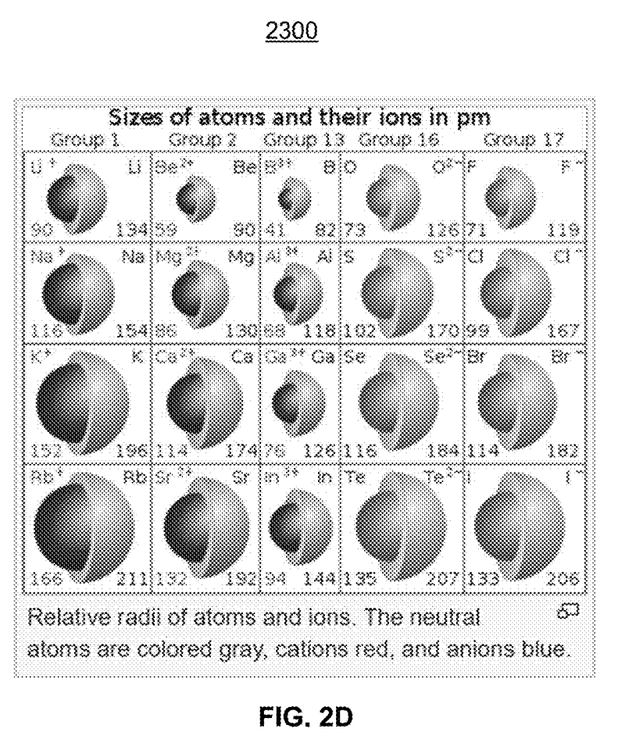
FIG. 2D is a chart illustrating an example relationship between the size of an atom and an ion for estimation of the monolayer oxide thickness in accordance with some implementations of the present disclosure.

To determine thinness of a dielectric film needed, FIG. 2D may be consulted. FIG. 2D is a chart illustrating an example relationship between the size of an atom and an ion and its estimated monolayer oxide thickness in accordance with some implementations of the present disclosure.

As shown in FIG. 2D, using $Al_2O_3$ as an example: the thickness of an $Al_2O_3$ monolayer is estimated to be more than the diameter of an Al ion plus the diameter of an oxygen ion: the diameter of an $O^{2-}$ ion is 0.252 nm; the diameter of an $Al^{3+}$ ionic is 0.136 nm; the size of an Al—O ion pair is 0.388 nm. Therefore, if the $Al_2O_3$ thickness is less than 0.4 nm, the Al2O3 film is discontinuous or in island shapes.

Experimentally, the rate of depositing $Al_2O_3$ during an Atomic Layer Deposition (ALD) process is approximately 0.1 nm/cycle, if fewer than 4 cycles are used or the thickness of the deposited $Al_2O_3$ layer is less than 0.4 nm (which usually results, when only 2-3 cycles are used), a complete $Al_2O_3$ monolayer is often not formed. In other words, under these circumstances, a discontinuous layer (as opposed to a complete or continuous layer) is often formed.

Again, assuming the rate of depositing $Al_2O_3$ during an Atomic Layer Deposition (ALD) process is approximately 0.1 nm/cycle, if more than 10 cycles are used or the thickness of the deposited $Al_2O_3$ layer is greater than 1 nm (which usually results, when 10 or more cycles are used), a complete $Al_2O_3$ monolayer is often formed. In other words, under these circumstances, a continuous layer (as opposed to a discontinuous layer) is often formed.

Using $SiO_2$ as an example: the diameter of a $Si^{4+}$ ion is 0.108 nm; the size of an Si—O ionic pair is 0.360 nm. Thus, a complete $SiO_2$ monolayer is often not formed, if the thickness of a deposited $SiO_2$ layer is less than 0.4 nm (which usually results, when less than 4 cycles are used).

Stated in another way, under these circumstances, a discontinuous layer (as opposed to a complete or continuous layer) is often formed.

Figure 2E:
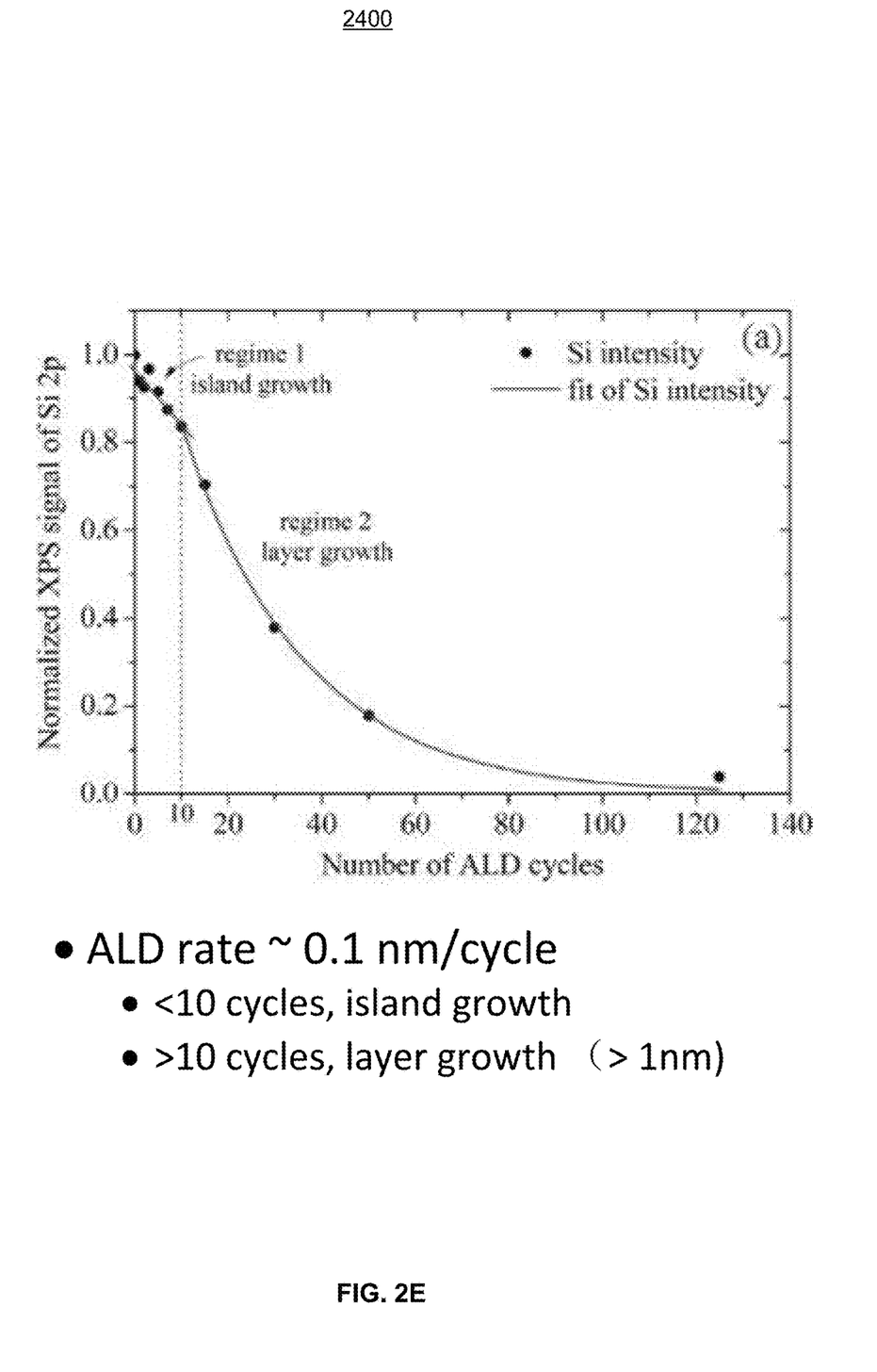
FIG. 2E is a chart illustrating an example relationship between the total number of ALD cycles and island growth and layer growth in accordance with some implementations of the present disclosure.

FIG. 2E is a chart illustrating an example relationship between the total number of ALD cycles and island growth and layer growth of $Al_2O_3$ on Si substrate in accordance with some implementations of the present disclosure.

As shown in FIG. 2E, when the rate of ALD is approximately 0.1 nm/cycle, during the first few cycles of an ALD process, a film will grow through a nucleation process, during which one or more islands are first formed. For example, within fewer than 10 cycles, a complete layer is often not formed, and island growth is more significant. This was illustrated by the linearly decreasing of Si surface area uncovered by $Al_2O_3$ during this period. When more than 10 cycles are used, layer growth is more significant, and a complete layer is often formed. Therefore, within 2-4 cycles of an $Al_2O_3$ deposition process, $Al_2O_3$ islands are first form. After 10 or more cycles, a complete $Al_2O_3$ layer is often formed.

Both the nano-scale islands (which may be less than 1 nano meter high) and the thin layer (which may be about 1 nm thick) are sufficiently thin to provide a soft breakdown, which reduces interface contact area and increases contact resistance, under a low electric field.

FIGS. 3A-3D are block diagrams illustrating an example interface engineering process for manufacturing a RRAM stack in accordance with some implementations of the present disclosure.

Figure 3A:
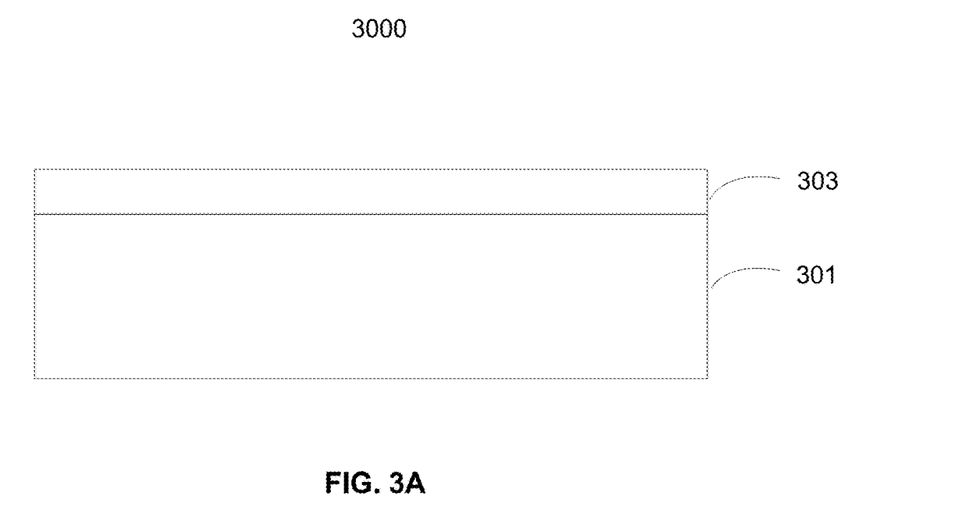
FIGS. 3A-3D are block diagrams illustrating an example interface engineering process for manufacturing a RRAM stack in accordance with some implementations of the present disclosure.

As shown in FIG. 3A, at step 3000, a substrate 301 may be provided first; a bottom electrode 303 may then be formed on the substrate 301. The substrate 301 is, in some implementations, made of one or more of the following materials: Si, $SiO_2$, $Si_3N_4$, $Al_2O_3$, AlN, or glass. The substrate 301 is, in some implementations, may consist of integrated circuits, transistors, and interconnects. The bottom electrode 303 is, in some implementations, made of one or more of the following materials: Pd, Pt, Ir, W, Ta, Hf, Nb, V, Ti, TiN, TaN, NbN, a combination thereof, or an alloy with any other conductive materials.

Figure 3B:
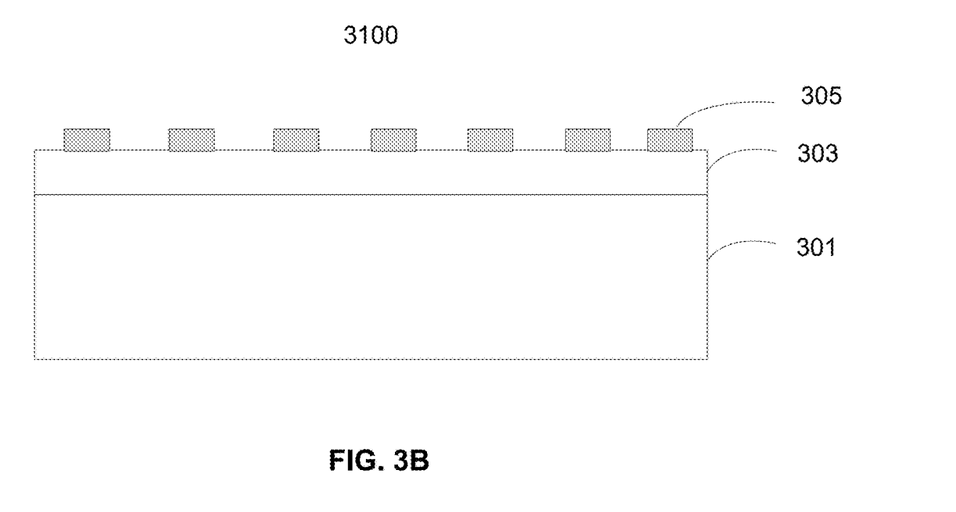

At step 3100, as shown in FIG. 3B, a discontinuous layer (e.g., a layer with one or more islands) 305 may be deposited on the bottom electrode 303. The discontinuous layer 305 is, in some implementations, made of one or more of the following materials: $Al_2O_3$, $SiO_2$, $Si_3N_4$, AlN, or a combination thereof. The discontinuous layer 305 is, in some implementations, less than 1 nm thick. The discontinuous layer 305 is deposited using 2-4 cycles of an ALD process. A layer may be called a discontinuous layer if this layer covers only some, but not all, portions of the layer underneath.

Figure 3C:
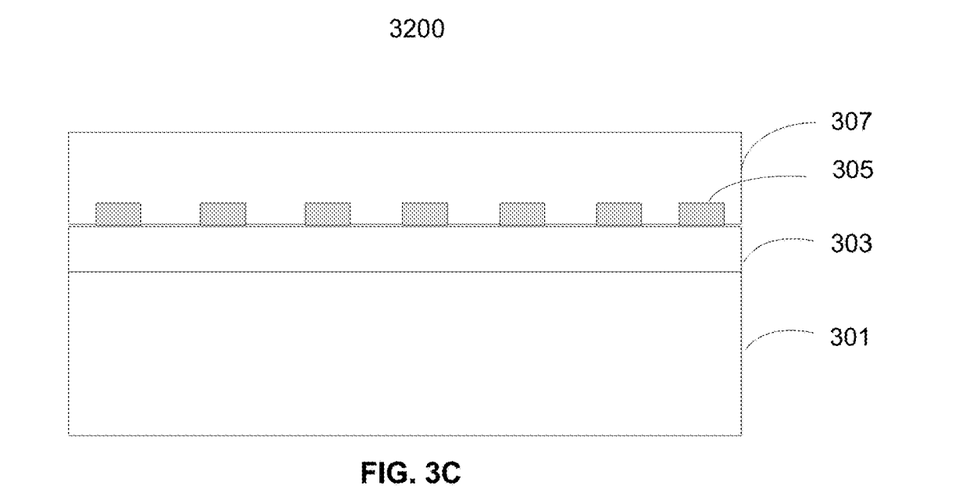

Next, at step 3200, as shown in FIG. 3C, an RRAM oxide layer 307 may be deposited on the bottom electrode 303 and the discontinuous layer 305.

The RRAM oxide layer 307 is, in some implementations, made of one or more of the following materials: $TaO_x$ (where x≤2.5), $HfO_x$ (where x≤2), $TiO_x$ (where x≤2), $ZrO_x$ (where x≤2), or a combination thereof.

Figure 3D:
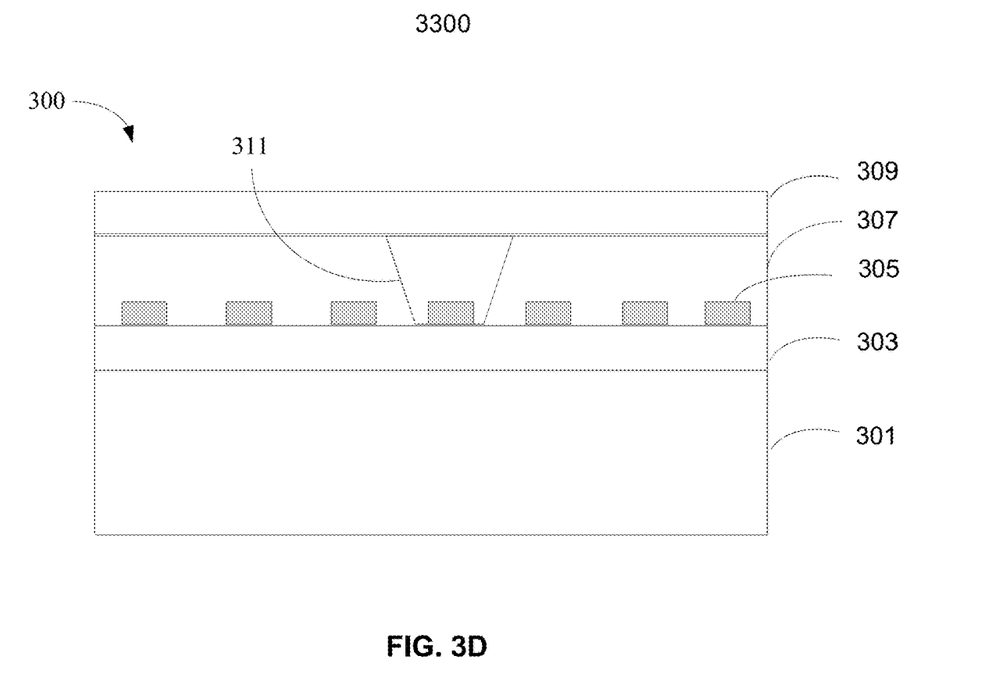

Further, at step 3300, as shown in FIG. 3D, a top electrode 309 may be deposited on the RRAM oxide layer 307, after which the RRAM stack 300 may be formed. The top electrode 309 is, in some implementations, made of one or more of the following materials: Pd, Pt, Ir, W, Ta, Hf, Nb, V, Ti, TiN, TaN, NbN, a combination thereof, or an alloy with any other conductive materials.

When an external voltage is applied to the RRAM stack 300, a conductive channel (e.g., a filament) 311 may be formed through the RRAM oxide layer 307. The effective contact area between the channel 311 and the bottom electrode 303 is reduced by the presence of the islands 305. If the islands 305 covers 50% of the surface area of the bottom electrode 303, the contact area between the channel 311 and the bottom electrode 303 is reduced by 50%, which, in turn, increases the contact resistance between the channel 311 and the bottom electrode 303 by a factor of 2, and also increase the channel resistance by a factor of 2.

Therefore, these technologies would maintain the desired multi-level and linearity characteristics of a RRAM filament, while requiring only a lower operation current due to the increase channel resistance (enabled by the presence of the islands).

FIGS. 4A-4D are block diagrams illustrating a second example interface engineering process for manufacturing a RRAM stack in accordance with some implementations of the present disclosure.

Figure 4A:
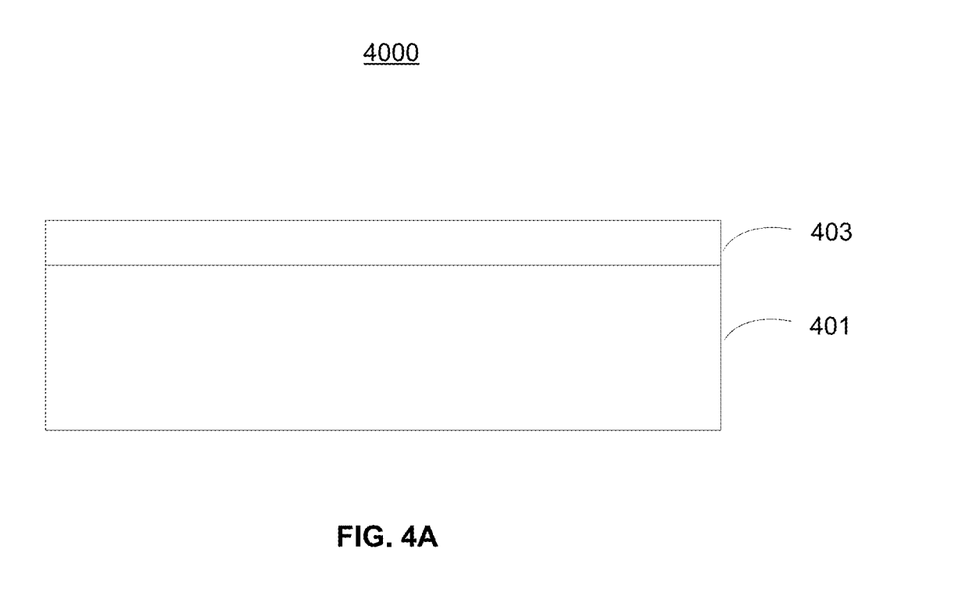
FIGS. 4A-4D are block diagrams illustrating a second example interface engineering process for manufacturing a RRAM stack in accordance with some implementations of the present disclosure.

As shown in FIG. 4A, at step 4000, a substrate 401 may be provided first; a bottom electrode 403 may then be formed on the substrate 401. The substrate 401 is, in some implementations, made of one or more of the following materials: Si, $SiO_2$, $Si_3N_4$, $Al_2O_3$, AlN, or glass. The substrate 401 is, in some implementations, may consist of integrated circuits, transistors, and interconnects. The bottom electrode 403 is, in some implementations, made of one or more of the following materials: Pd, Pt, Ir, W, Ta, Hf, Nb, V, Ti, TiN, TaN, NbN, a combination thereof, or an alloy with any other conductive materials.

Figure 4B:
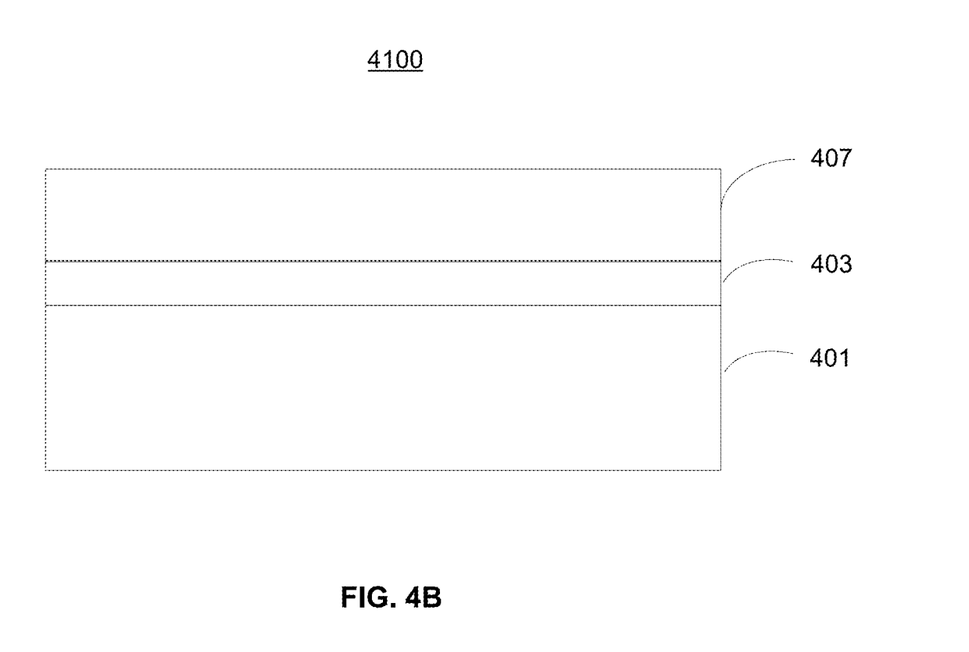

Next, as shown in FIG. 4B, deposit an RRAM oxide layer 407 on the bottom electrode 403.

At step 4100, as shown in FIG. 4B, an RRAM oxide layer 407 may be deposited on the bottom electrode 403. The RRAM oxide layer 407 is, in some implementations, made of one or more of the following materials: $TaO_x$ (where x≤2.5), $HfO_x$ (where x≤2), $TiO_x$ (where x≤2), $ZrO_x$ (where x≤2), or a combination thereof.

Figure 4C:
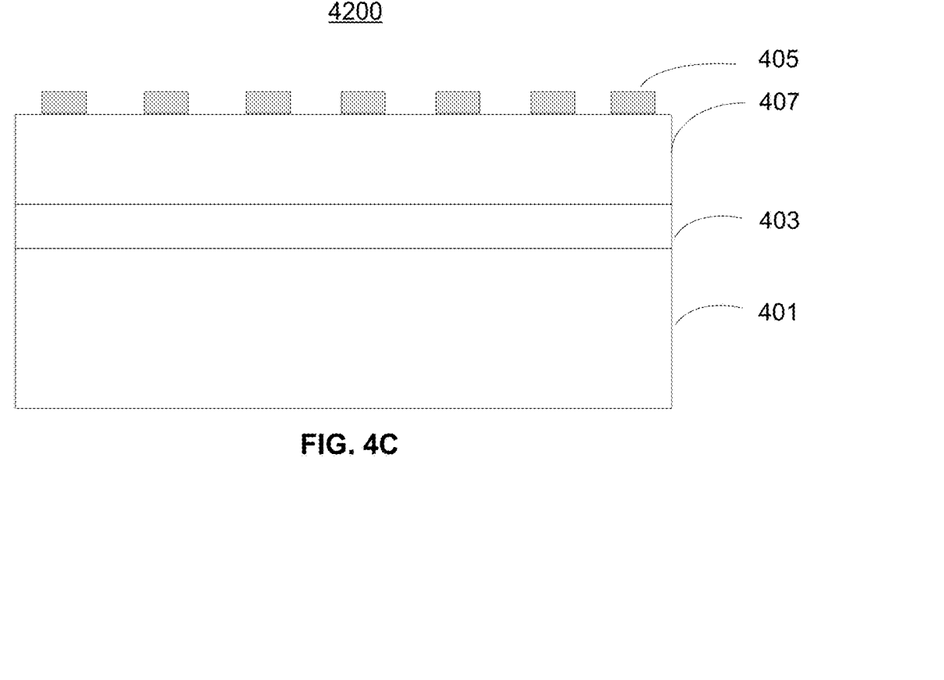

Next, at step 4200, as shown in FIG. 4C, a discontinuous layer 405 (e.g., a layer with one or more islands) may be deposited on the RRAM oxide layer 407. The discontinuous layer 405 is, in some implementations, made of one or more of the following materials: $Al_2O_3$, $SiO_2$, $Si_3N_4$, AlN, or a combination thereof. The discontinuous layer 405 is, in some implementations, less than 0.4 nm thick. The discontinuous layer 405 is deposited using 2-4 cycles of an ALD process. As noted above, a layer may be called a discontinuous layer if this layer covers only some portion of the layer underneath.

Figure 4D:
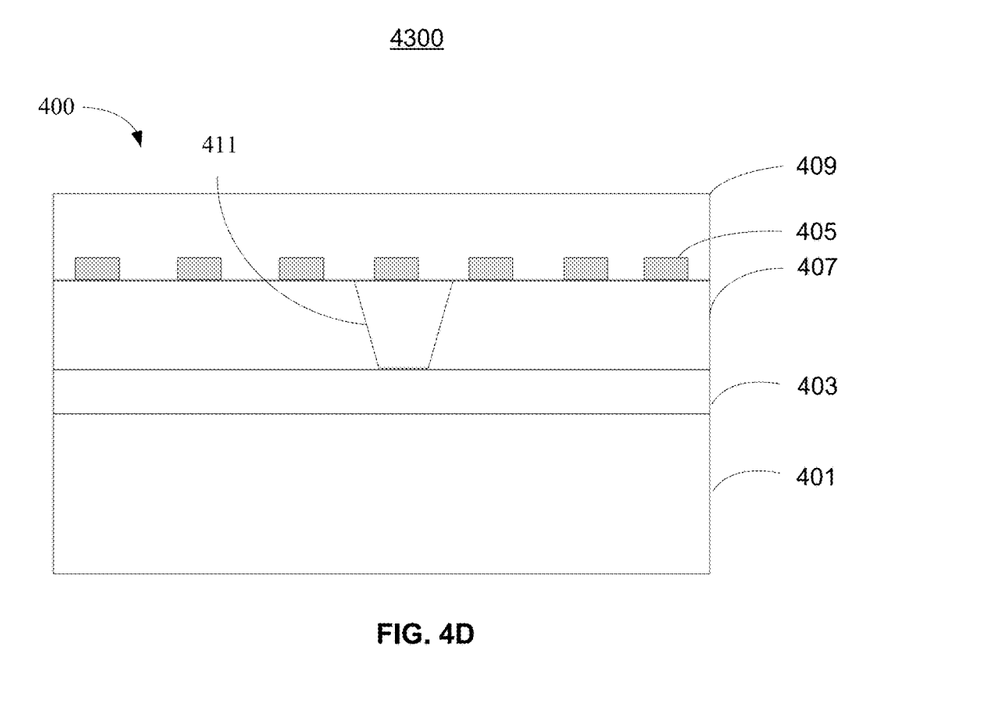

Further, at step 4300, as shown in FIG. 4D, a top electrode 409 may be deposited on the discontinuous layer 405, after which the RRAM stack 400 may be. The top electrode 409 is, in some implementations, made of one or more of the following materials: Pd, Pt, Ir, W, Ta, Hf, Nb, V, Ti, TiN, TaN, NbN, a combination thereof, or an alloy with any other conductive materials.

When an external voltage is applied to the RRAM stack 400, a conductive channel (e.g., a filament) 411 may be formed through the RRAM oxide layer 407. The effective contact area between the channel 411 and the top electrode 409 is reduced by the presence of the islands 405. If the islands 405 covers 50% of the surface area of the top electrode 409, the contact area between the channel 411 and the top electrode 409 is reduced by 50%, which, in turn, increases the contact resistance between the channel 411 and the top electrode 409 by a factor of 2, and also the channel resistance by a factor of 2.

FIGS. 5-8 are block diagrams illustrating example RRAM stacks manufactured with different interface engineering techniques in accordance with some implementations of the present disclosure.

Figure 5:
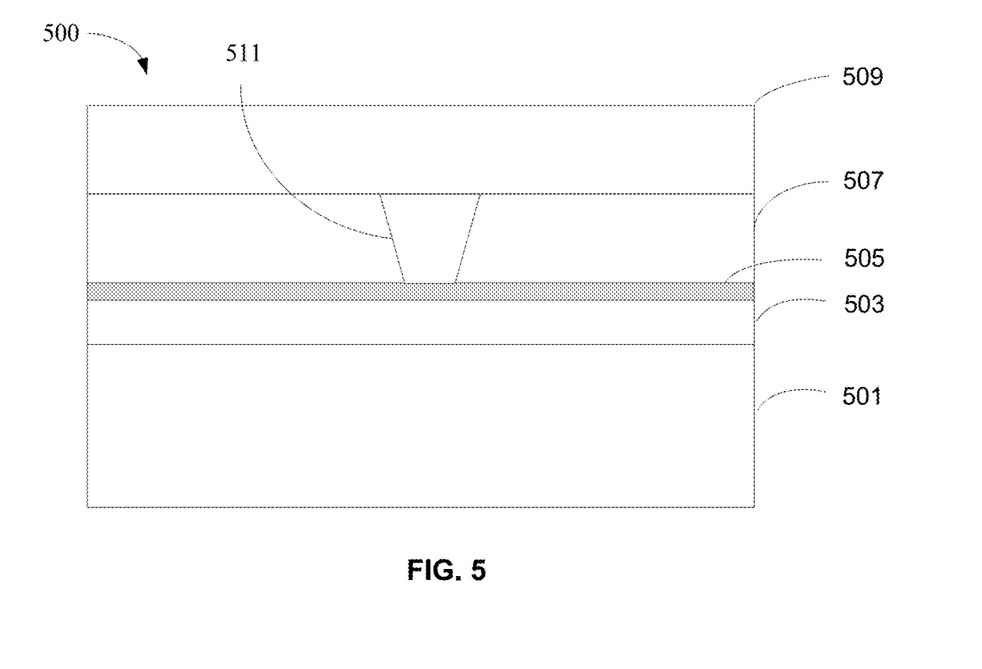
FIGS. 5-8 are block diagrams illustrating example RRAM stacks manufactured with different interface engineering techniques in accordance with some implementations of the present disclosure.

As shown in FIG. 5, an example RRAM stack 500 includes a substrate 501, a bottom electrode 503 formed on the substrate 501, an interlayer 505 formed on the bottom electrode 503, an RRAM oxide layer 507 formed on the interlayer 505, and a top electrode 509 formed on the RRAM oxide layer 507. A conductive channel (e.g., a filament) 511 may be formed through the RRAM oxide layer 507 when an external voltage is applied to the RRAM stack 500.

The interlayer 505 is, in some implementations, made of one or more of the following materials: $Al_2O_3$, $SiO_2$, $Si_3N_4$, AlN, or a combination thereof. The thickness of the interlayer 505 is, in some implementations, less than 1 nm. In some implementations, the interlayer 505 is deposited using fewer than 10 cycles of an ALD process.

Figure 6:
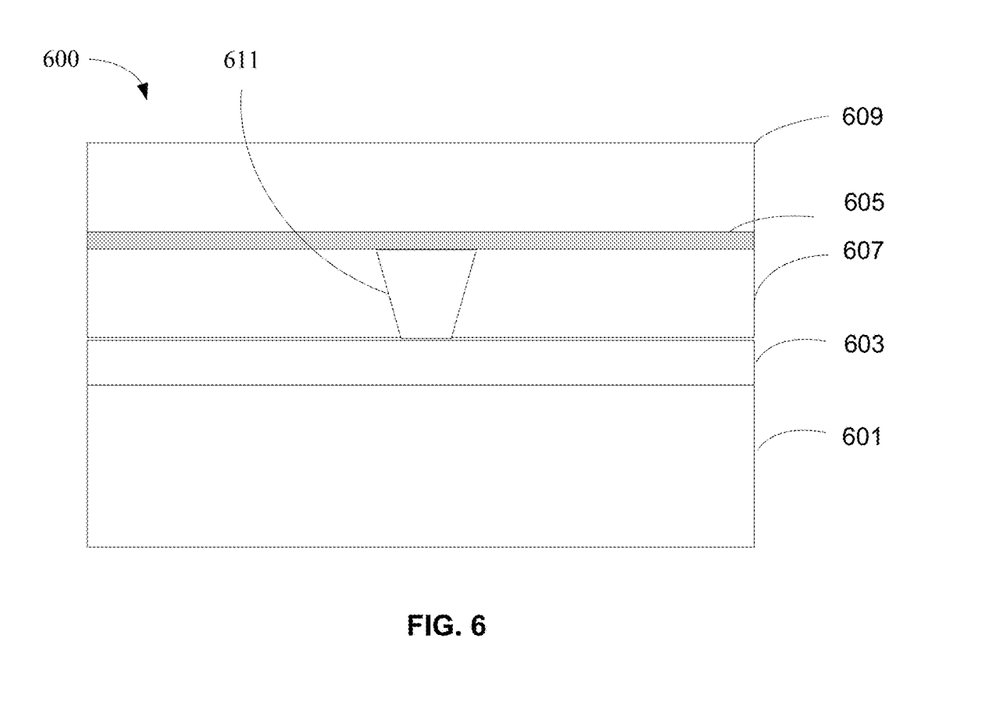

As shown in FIG. 6, an example RRAM stack 600 includes a substrate 601, a bottom electrode 603 formed on the substrate 601, an RRAM oxide layer 607 formed on the bottom electrode 603, an interlayer 605 formed on the RRAM oxide layer 607, and a top electrode 609 formed on the interlayer 605. A conductive channel (e.g., a filament) 611 may be formed through the RRAM oxide layer 607 when an external voltage is applied to the RRAM stack 600.

The interlayer 605 is, in some implementations, made of one or more of the following materials: $Al_2O_3$, $SiO_2$, $Si_3N_4$, AlN, or a combination thereof. The thickness of the interlayer 605 is, in some implementations, less than 1 nm. In some implementations, the interlayer 605 is deposited using fewer than 10 cycles of an ALD process.

Figure 7:
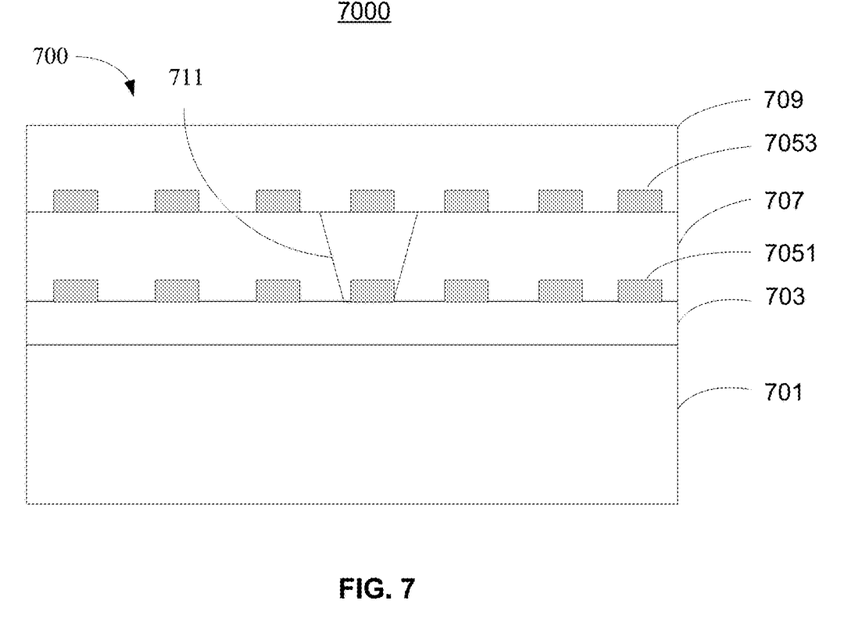

As shown in FIG. 7, an example RRAM stack 700 includes a substrate 701, a bottom electrode 703 formed on the substrate 701, a first discontinuous layer 7051 formed on the bottom electrode 703, an RRAM oxide layer 707 formed on the first discontinuous layer 7051 and the bottom electrode 703, a second discontinuous layer 7053 formed on the RRAM oxide layer 707, and a top electrode 709 formed on the second discontinuous layer 7053 and the RRAM oxide layer 707. A conductive channel (e.g., a filament) 711 may be formed through the RRAM oxide layer 707 when an external voltage is applied to the RRAM stack 700.

The first discontinuous layer 7051 and the second discontinuous layer 7053 are, in some implementations, made of one or more of the following materials: $Al_2O_3$, $SiO_2$, $Si_3N_4$, AlN, or a combination thereof. The thicknesses of the first discontinuous layer 7051 and the second discontinuous layer 7053 are, in some implementations, both less than 0.4 nm. In some implementations, the first discontinuous layer 7051 and the second discontinuous layer 7053 are deposited using 2-4 cycles of an ALD process.

Figure 8:
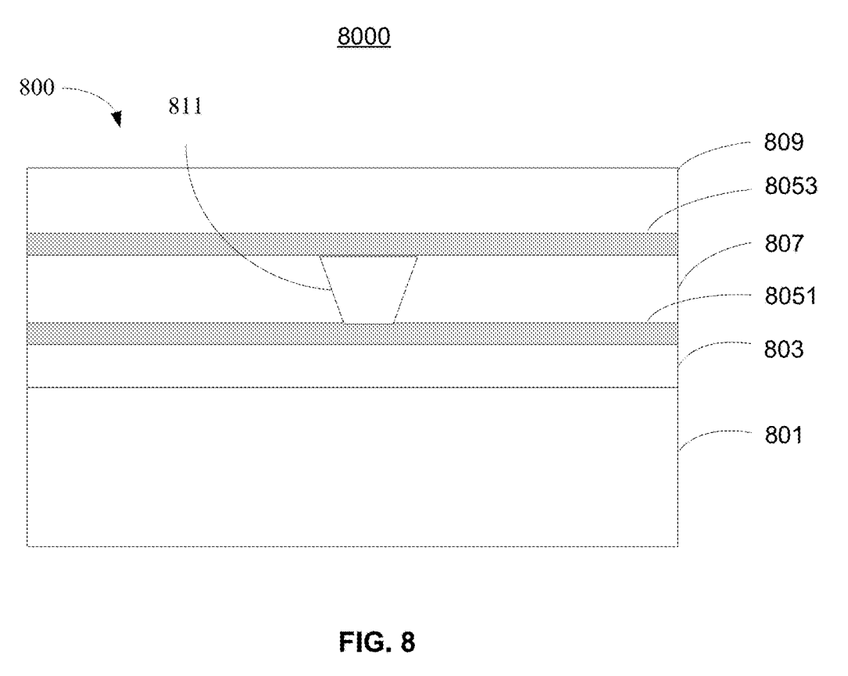

As shown in FIG. 8, an example RRAM stack 800 includes a substrate 801, a bottom electrode 803 formed on the substrate 801, a first interlayer 8051 formed on the bottom electrode 803, an RRAM oxide layer 807 formed on the first interlayer 8051, a second interlayer 8053 formed on the RRAM oxide layer 807, and a top electrode 809 formed on the second interlayer 8053. A conductive channel (e.g., a filament) 811 may be formed through the RRAM oxide layer 807 when an external voltage is applied to the RRAM stack 800.

The first interlayer 8051 and the second interlayer 8053 are, in some implementations, made of one or more of the following materials: $Al_2O_3$, $SiO_2$, $Si_3N_4$, AlN, or a combination thereof. The thicknesses of the first interlayer 8051 and the second interlayer 8053 are, in some implementations, both less than 1 nm. In some implementations, the first interlayer 8051 and the second interlayer 8053 are deposited using fewer than 10 cycles of an ALD process.

In FIGS. 7-8, the two interface layers from the same cell may be either both discontinuous or both continuous. In some other implementations, one layer may be discontinuous, while the other layer is continuous.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
a substrate;
a bottom electrode formed on the substrate;
a first layer formed on the bottom electrode, wherein the first layer comprises a discontinuous layer of a first material;
a resistive random-access memory (RRAM) oxide layer formed on the first layer and the bottom electrode, wherein the RRAM oxide layer comprises a second material, and wherein a bandgap of the first material is wider than a bandgap of the second material; and
a top electrode formed on the RRAM oxide layer.

2. The apparatus as claimed in claim 1, wherein the substrate comprises at least one of Si, $SiO_2$, $Si_3N_4$, $Al_2O_3$, AlN, or glass.

3. The apparatus as claimed in claim 1, wherein the bottom electrode comprises at least one of Pd, Pt, Ir, W, Ta, Hf, Nb, V, Ti, TiN, TaN, or NbN.

4. The apparatus as claimed in claim 1, wherein the second material comprises at least one of $TaO_x$ (where $x \leq 2.5$), $HfO_x$ (where $x \leq 2$), $TiO_x$ (where $x \leq 2$), $ZrO_x$ (where $x \leq 2$).

5. The apparatus as claimed in claim 1, wherein the discontinuous layer of the first material comprises one or more islands deposited on the bottom electrode.

6. The apparatus as claimed in claim 1, wherein the first material comprises at least one of an oxide material or a nitride material, and wherein the oxide material or the nitride material comprises at least one of $Al_2O_3$, $SiO_2$, $Si_3N_4$, AlN.

7. The apparatus as claimed in claim 1, wherein a thickness of the first layer is less than 0.4 nm.

8. The apparatus as claimed in claim 1, further comprises a second layer formed between the RRAM oxide layer and the top electrode, wherein the second layer comprises a third material, and wherein a bandgap of the third material is wider than the bandgap of the second material.

9. The apparatus as claimed in claim 8, wherein the second layer comprises a discontinuous layer of the third material.

10. The apparatus as claimed in claim 9, wherein a thickness of the second layer is less than 0.4 nm.

11. An apparatus comprising:
a substrate;
a bottom electrode formed on the substrate;
a resistive random-access memory (RRAM) oxide layer formed on the bottom electrode;
a first layer formed on the RRAM oxide layer, wherein the first layer comprises a discontinuous layer of a first material, wherein the RRAM oxide layer comprises a second material, and wherein a bandgap of the first material is wider than a bandgap of the second material; and
a top electrode formed on the first layer and the RRAM oxide layer.

12. The apparatus as claimed in claim 11, wherein the discontinuous layer of the first material comprises one or more islands deposited on the RRAM oxide layer.

13. The apparatus as claimed in claim 11, further comprising a second layer formed on the bottom electrode, wherein the second layer comprises a third material, and wherein a bandgap of the third material is wider than the bandgap of the second material.

14. The apparatus as claimed in claim 12, wherein the second layer is a continuous layer of the third material.

15. The apparatus as claimed in claim 11, wherein the second layer comprises a discontinuous layer of the third material.

16. An apparatus comprising:
a substrate;
a bottom electrode formed on the substrate;
a first interlayer formed on the bottom electrode, wherein the first interlayer comprises a first material;
a resistive random-access memory (RRAM) oxide layer formed on the first interlayer, wherein the RRAM oxide layer comprises a second material, and wherein a bandgap of the first material is wider than a bandgap of the second material; and
a top electrode formed on the RRAM oxide layer.

17. The apparatus as claimed in claim 16, further comprising a second interlayer formed between the RRAM oxide layer and the top electrode, wherein the second interlayer comprises a third material, and wherein a bandgap of the third material is wider than the bandgap of the second material.

18. The apparatus as claimed in claim 16, wherein a thickness of the first interlayer is less than 1 nm.

* * * * *